(12) United States Patent
Kim

(10) Patent No.: US 12,218,495 B2
(45) Date of Patent: Feb. 4, 2025

(54) BUS BAR ASSEMBLY

(71) Applicants: Hyundai Motor Company, Seoul (KR); Kia Corporation, Seoul (KR)

(72) Inventor: Yun Ho Kim, Seoul (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 0 days.

(21) Appl. No.: 18/389,464

(22) Filed: Nov. 14, 2023

(65) Prior Publication Data
US 2024/0429695 A1 Dec. 26, 2024

(30) Foreign Application Priority Data

Jun. 22, 2023 (KR) .................. 10-2023-0080524

(51) Int. Cl.
| | | |
|---|---|---|
| *H02K 3/18* | (2006.01) | |
| *B60R 16/023* | (2006.01) | |
| *H01H 85/02* | (2006.01) | |
| *H02G 5/04* | (2006.01) | |
| *H05K 9/00* | (2006.01) | |
| *B60L 50/60* | (2019.01) | |

(52) U.S. Cl.
CPC ............ *H02G 5/04* (2013.01); *B60R 16/0238* (2013.01); *H01H 85/0241* (2013.01); *H05K 9/002* (2013.01); *B60L 50/60* (2019.02); *B60L 2210/40* (2013.01)

(58) Field of Classification Search
None
See application file for complete search history.

(56) References Cited

U.S. PATENT DOCUMENTS

| | | | | |
|---|---|---|---|---|
| 2005/0258765 | A1* | 11/2005 | Rodriguez | ............. H05B 41/38 |
| | | | | 315/86 |
| 2018/0162233 | A1* | 6/2018 | Oya | ................... H01M 8/04567 |
| 2020/0153302 | A1* | 5/2020 | Yoshida | ................... H02K 3/38 |
| 2021/0359620 | A1* | 11/2021 | Miura | ..................... H02H 7/008 |
| 2021/0359677 | A1* | 11/2021 | Miura | ..................... H02P 27/06 |

* cited by examiner

Primary Examiner — Alfonso Perez Borroto
Assistant Examiner — Esayas G Yeshaw
(74) Attorney, Agent, or Firm — Morgan, Lewis & Bockius LLP

(57) ABSTRACT

A bus bar assembly includes a first bus bar including a narrowing portion with a reduced cross-sectional area in a first direction between the end portions thereof, a second bus bar spaced from the first bus bar, an arc-blocking portion disposed to surround the narrowing portion at the least, a magnetic core disposed on the outside of the arc-blocking portion, and a housing accommodating respective portions of the first bus bar and the second bus bar, the arc-blocking portion, and the magnetic core.

19 Claims, 5 Drawing Sheets

BUS BAR ASSEMBLY

CROSS REFERENCE TO RELATED APPLICATION

The present application claims priority to Korean Patent Application No. 10-2023-0080524, filed Jun. 22, 2023, the entire contents of which is incorporated herein for all purposes by this reference.

BACKGROUND OF THE PRESENT DISCLOSURE

Field of the Present Disclosure

The present disclosure relates to a bus bar assembly including an inverter bus bar structure in which an electromagnetic wave reduction core and fuse are integrated.

DESCRIPTION OF RELATED ART

With the recent increase in environmental concern, the number of eco-friendly vehicles provided with electric motors as a power source is on the rise. Eco-friendly vehicles are also referred to as electrified vehicles, and typical examples are electric vehicles (EV) and hybrid electric vehicles (HEV). The electrified vehicles may be driven by driving force received from a high-power motor, and a high-voltage battery and an inverter may be provided to drive the motor.

An inverter of an electrified vehicle converts direct current (DC) received from a high-voltage battery into alternating current (AC) and supplies the AC to a motor. Because the high-voltage battery and the inverter are physically separated from each other, the battery and the inverter may be electrically connected through a connecting device such as a bus bar.

In the instant case, noise may be introduced into the inverter, depending on the structure of the current flow path, and the introduced noise may be distorted or amplified through switching operations and the like in the inverter. Such noise may affect the electromagnetic performance of vehicles. With the accelerating proliferation of electrified vehicles and the strengthening of regulations on electromagnetic waves in recent years, there is an increasing need to implement configurations for reducing electromagnetic waves inside vehicles.

On the other hand, high-voltage fuses may be provided in the high-voltage battery and junction blocks of electrified vehicles to interrupt the flow of current in certain situations. High-voltage fuses may prevent damage to the vehicle caused by fire or the like by physically disconnecting the bus bar carrying the current when an excessive current is abruptly generated due to a vehicle failure or an accident. As high-voltage batteries with even higher voltages are applied to enhance the performance of electrified vehicles in recent years, there is a growing need to install fuses in the inverter as well so that burnout may be prevented before the fuse in the high-voltage battery is activated even if excessive current is applied to the inverter and motor system.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a bus bar assembly that allows the installation of an electromagnetic wave reduction device and a fuse in an inverter by eliminating a spatial constraint through a bus bar including an integrated structure of the electromagnetic wave reduction device and the fuse.

The object of the present disclosure is not limited to the object described above, and other objects not mentioned will be clearly understood by those skilled in the art from the following description.

According to an exemplary embodiment of the present disclosure for achieving the object described above, a bus bar assembly includes a first bus bar corresponding to a first pole, extending in a first direction, and including a narrowing portion with a reduced cross-sectional area in the first direction between end portions of the first bus bar, a second bus bar, corresponding to a second pole, extending in the first direction, and spaced from the first bus bar in the second direction intersecting the first direction, an arc-blocking portion disposed to surround a portion of the first bus bar and the second bus bar to surround the narrowing portion at the least, a magnetic core disposed outside the arc-blocking portion to surround respective predetermined portions of the first bus bar and the second bus bar, and a housing accommodating the respective portions of the first bus bar and the second bus bar, the arc-blocking portion, and the magnetic core.

For example, inside the housing, a first space in which the respective portions of the first bus bar and the second bus bar and the arc-blocking portion are disposed and a second space provided on the outside of the first space for the magnetic core to be disposed therein and separated from the first space may be provided.

For example, the housing includes open end portions spaced from each other in the first direction, and a partition wall with a smaller periphery than the housing may be provided inside the housing, wherein the first space may be formed inside the partition wall while the second space may be formed between the partition wall and the housing.

For example, the housing may include a case including an internal space integrally formed by one end portion, which is closed, and a side extending from the closed one end portion in the first direction and a cover coupled to the case to close the other end portion spaced from the closed one end portion in the first direction, wherein a plurality of through holes allowing passage of the first bus bar and the second bus bar in the first direction may be provided at the closed one end portion thereof and the cover of the case.

For example, the respective cross-sectional areas of the plurality of through holes may correspond to the cross-sectional areas of the first bus bar or the second bus bar.

For example, the narrowing portion may have perforations made at a plurality of points between the end portions of the first bus bar in a third direction crossing the first direction and the second direction thereof.

For example, the narrowing portion may include a perforation, made in the third direction, repeating itself in the second direction thereof.

For example, the narrowing portion may include a perforation repeating itself at positions spaced apart in the first direction on the first bus bar.

For example, the narrowing portion may include a reduced thickness in the third direction compared to the end portions of the first bus bar and include a step difference from the end portions of the first bus bar.

For example, the first bus bar and the second bus bar may be disposed between the battery provided in the vehicle and the inverter that converts the DC power of the battery into AC power.

According to the various embodiments of the present disclosure as described above, an electromagnetic wave reduction core and a fuse may be mounted through a bus bar structure in which the electromagnetic wave reduction core and fuse are integrated.

Furthermore, by reducing the total volume of the electromagnetic wave reduction core and fuse compared to when they are individually installed, it is possible to save space, provide a structure easily applicable to the inverter, and improve space utilization.

Furthermore, integrating individual components allows cost reduction.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
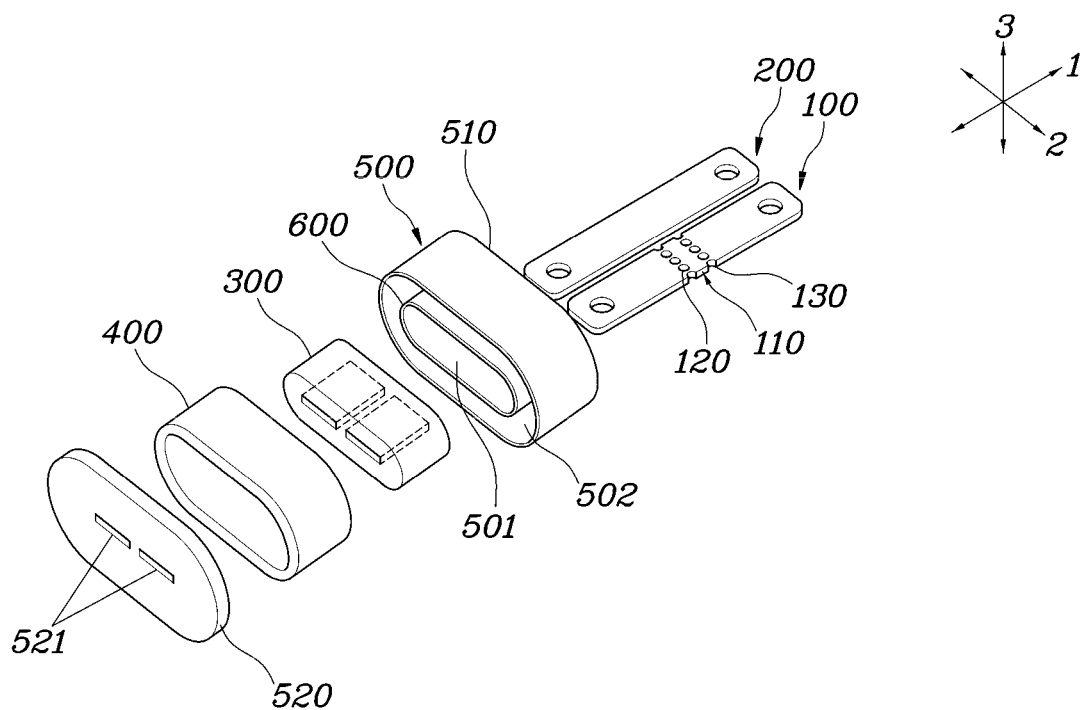
FIG. 1 is a view exemplarily illustrating a disassembled bus bar assembly according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Specific structural or functional descriptions of the exemplary embodiments of the present disclosure included herein or the application are presented only for describing embodiments of the present disclosure, and the present disclosure may be implemented as various embodiments which should not be construed as limited to the exemplary embodiments described herein or in the application.

Because the exemplary embodiments of the present disclosure may be subjected to various modifications and may assume many forms, specific embodiments will be illustrated in the drawings and described in detail herein or in the application. However, this is not intended to limit embodiments according to the concept of the present disclosures to particular disclosure forms and should be understood to include all modifications, equivalents, and substitutes included in the scope of ideas and technology of the present disclosure.

Unless defined otherwise, all terms used herein, including technical or scientific terms, include the same meaning as commonly understood by those with ordinary skill in the art to which the present disclosure pertains. Terms such as those defined in commonly used dictionaries should be construed as including a meaning consistent with the meaning in the context of the related art and are not to be construed in an ideal or overly formal meaning unless explicitly defined herein.

The exemplary embodiments included herein will be described in detail with reference to the accompanying drawings. However, the same or similar components will be provided the same reference numerals regardless of the drawing numbers, and the repetitive descriptions regarding these components will be omitted.

The suffixes "module" and "unit" for the components used in the following description are provided or interchangeably used only to facilitate the writing of the specification, without necessarily indicating a distinct meaning or role of their own.

When it is determined that the specific description of the related and already known technology may obscure the essence of the exemplary embodiments included herein, the specific description will be omitted. Furthermore, it is to be understood that the accompanying drawings are only intended to facilitate understanding of the exemplary embodiments included herein and are not intended to limit the technical ideas included herein are not limited to the accompanying drawings and include all the modifications, equivalents, or substitutions within the spirit and technical scope of the present disclosure.

The terms including ordinal numbers such as first, second, and the like may be used to describe various components, but the components are not to be limited by the terms. The terms may only be used for distinguishing one component from another.

It is to be understood that when a component is referred to as being "connected" or "coupled" to another component, the component may be directly connected or coupled to the another component, but other components may be interposed therebetween. In contrast, it is to be understood that when a component is referred to as being "directly connected" or "directly coupled" to another component, no other component is interposed.

Singular expressions include plural expressions unless the context explicitly indicates otherwise.

In the present specification, terms such as "comprise" or "have" are intended to indicate the presence of implemented features, numbers, steps, manipulations, components, parts, or combinations thereof described in the specification and are not to be understood to preclude the presence or additional possibilities of one or more of other features, numbers, steps, manipulations, components, parts or combinations thereof.

According to an exemplary embodiment of the present disclosure, a bus bar assembly is implemented by integrating an electromagnetic wave reduction core and a fuse with the bus bar, and as a result, overall volume and cost are reduced, space utilization is improved, and application to various devices is facilitated.

A bus bar assembly according to an exemplary embodiment of the present disclosure will be described in detail with reference to FIG. 1, FIG. 2, and FIG. 3.

Figure 2:
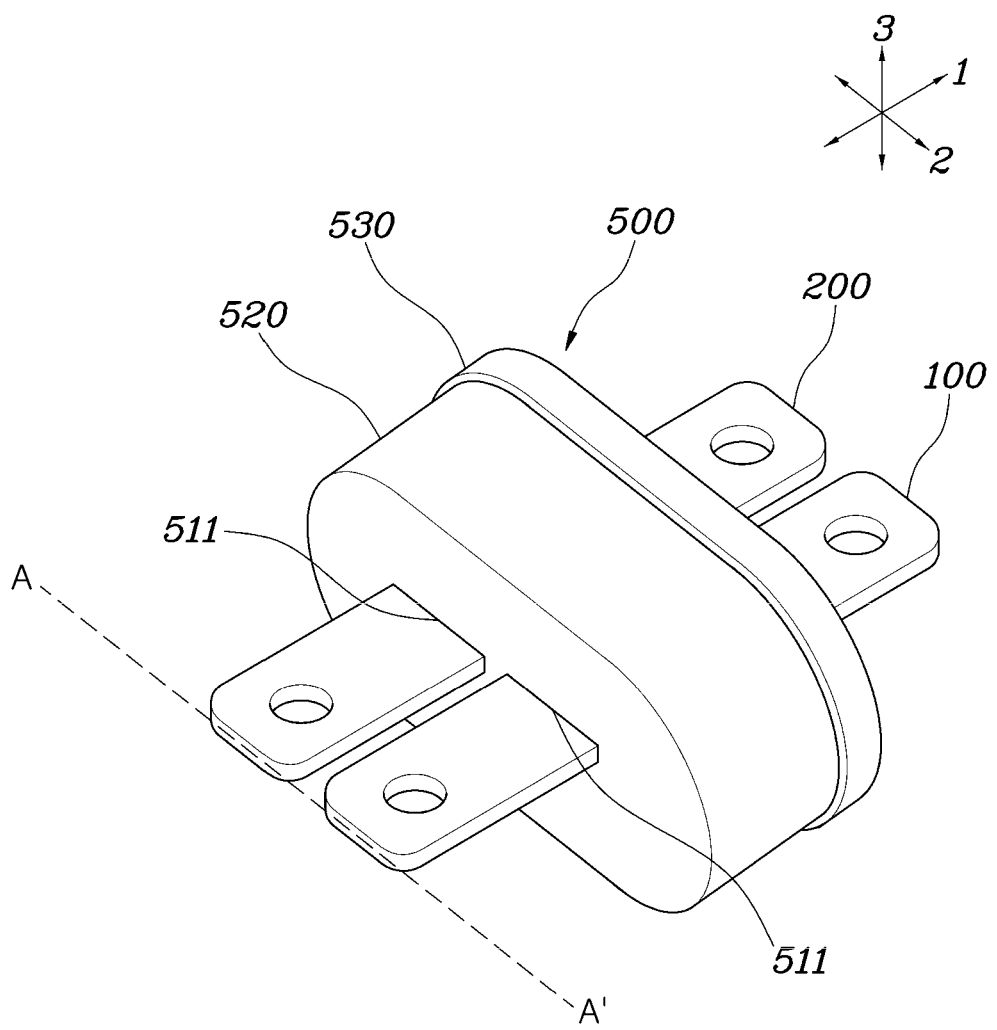
FIG. 2 is a view exemplarily illustrating an assembled bus bar assembly according to an exemplary embodiment of the present disclosure.
Figure 3:
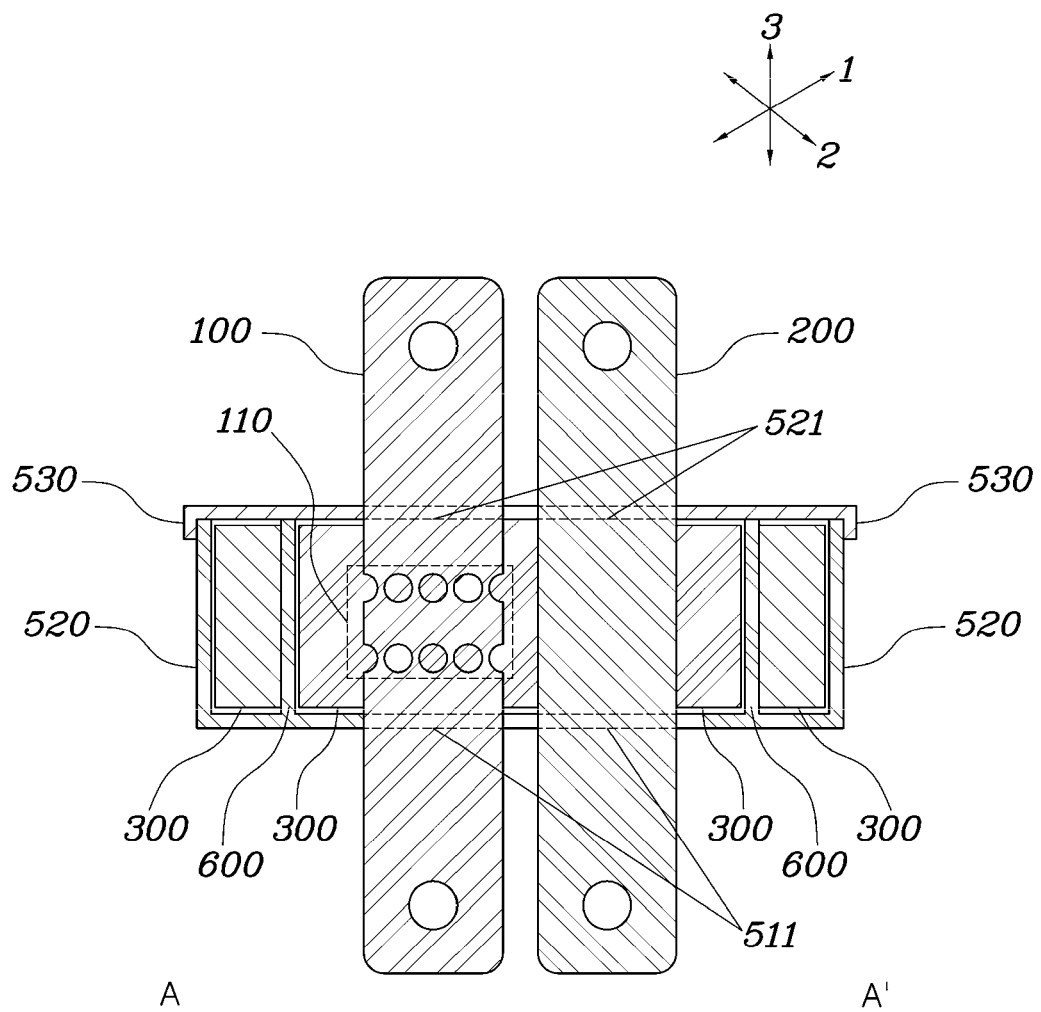
FIG. 3 is a view exemplarily illustrating a cross-section of the bus bar assembly taken along line A-A' in FIG. 2.
Figure 4:
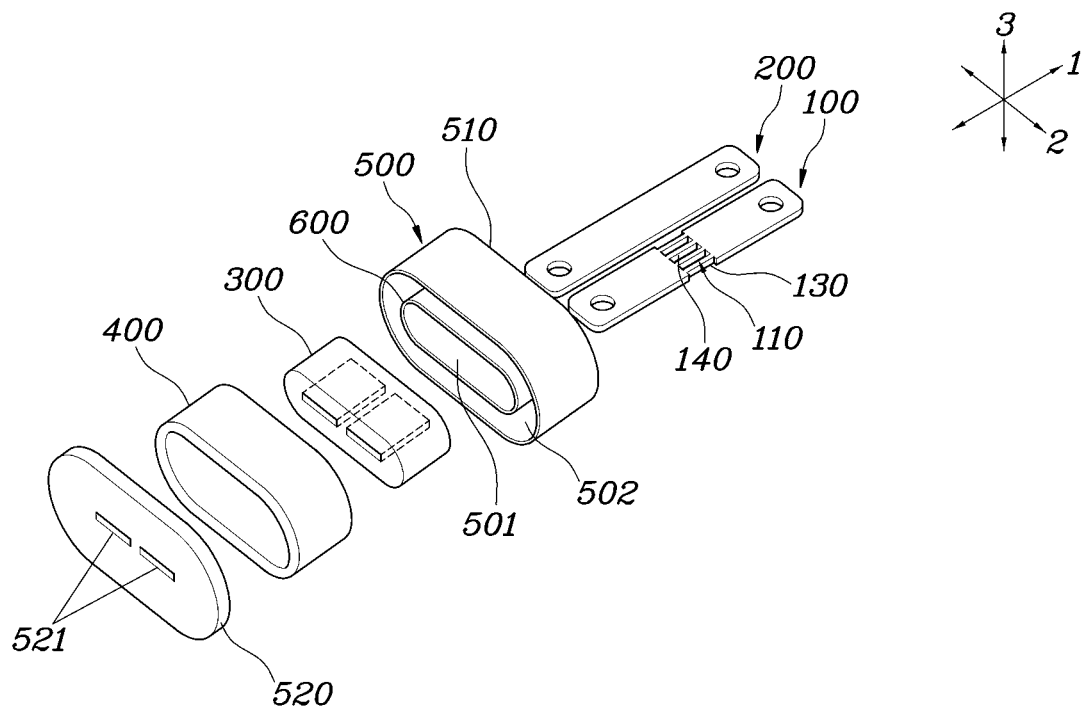
FIG. 4 and FIG. 5 are views exemplarily illustrating disassembled bus bar assemblies according to other embodiments of the present disclosure.
Figure 5:
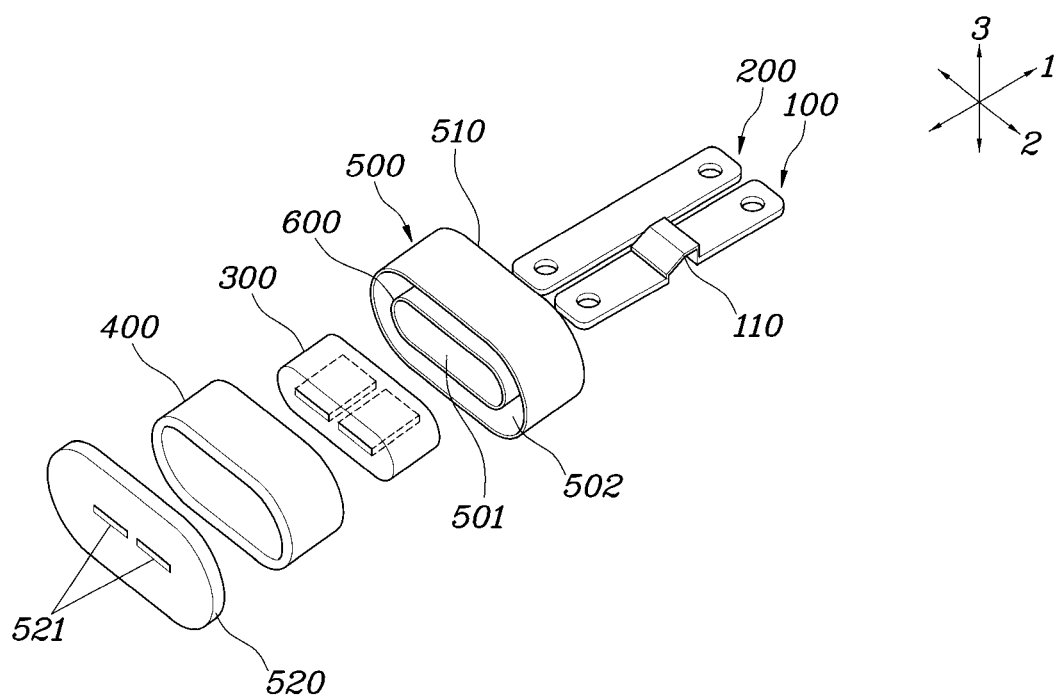

FIG. 1 is a view exemplarily illustrating a disassembled bus bar assembly according to an exemplary embodiment of the present disclosure, FIG. 2 is a view exemplarily illustrating an assembled bus bar assembly according to an exemplary embodiment of the present disclosure, FIG. 3 is a view exemplarily illustrating a cross-section of the bus bar assembly taken along line A-A' in FIG. 2, and FIG. 4 and FIG. 5 are views exemplarily illustrating disassembled bus bar assemblies according to other embodiments of the present disclosure.

FIG. 1, FIG. 2, FIG. 3, FIG. 4, and FIG. 5 show that a bus bar assembly according to an exemplary embodiment of the present disclosure may include a first bus bar 100, a second bus bar 200, an arc-blocking portion 300, a magnetic core 400, and a housing 500. However, FIG. 1 primarily illustrates components related to the description of an exemplary embodiment of the present disclosure, and an actual bus bar assembly may include more or fewer components than illustrated. Each component will be described in detail below.

First, the first bus bar 100 corresponds to a first pole, extends in a first direction and may include a narrowing portion 110 with a reduced cross-sectional area in the first direction between the end portions. The second bus bar 200 corresponds to a second pole, extends in the first direction, and is spaced from the first bus bar 100 in a second direction crossing the first direction.

Here, the first pole and second pole may be anode and cathode respectively, and may correspond to the end portions of a high-voltage battery provided in a vehicle. Furthermore, the first bus bar 100 and the second bus bar 200 may be disposed parallel to each other.

The first bus bar 100 includes a narrowing portion 110 between end portions in the first direction, and the narrowing portion 110 includes a reduced cross-sectional area in the first direction compared to other portions of the first bus bar 100.

The narrowing portion 110 may include a reduced cross-sectional area in the first direction due to the perforations made at a plurality of positions between the end portions of the first bus bar 100 in the third direction thereof. Furthermore, the narrowing portion 110 may include the perforation, made in the third direction, repeating itself in the second direction, and the perforation may also repeat itself at positions spaced from each other in the first direction on the first bus bar 100.

For example, as illustrated in FIG. 1, the narrowing portion 110 may include the perforation 120, made in the third direction, repeating itself in the second direction, and the repeated perforations 120 may be arranged in two rows spaced from each other in the first direction. In addition, the perforation 120 may be formed in single or plural.

The number of the rows of the repeated perforations 120 is not limited to the two rows and thus the number of the rows of the repeated perforations 120 include a single row and equal to or more than the two rows.

An exemplary embodiment of the present disclosure may further include at least a groove 130 on a lateral side of the narrowing portion 110 in the second direction. Furthermore, if the groove 130 is in plural, the plurality of the grooves 130 is formed in the first direction.

In addition, in an exemplary embodiment of the present disclosure, the narrowing portion 110 can be formed by the perforation 120, the groove 130 or a combination of the perforation 120 and the groove 130.

In contrast, FIG. 4 illustrating another exemplary embodiment of the present disclosure shows that the narrowing portion 110 may be implemented in a slit 140 in which the perforation made in the third direction repeat itself in the second direction but the perforations are elongated in the first direction instead of being arranged in two rows as illustrated in FIG. 1. In addition, the slit 140 may be formed in single or plural. Furthermore, the elongation direction of the slit 140 is not limited to the first direction but can be formed in the second direction.

The number of the rows of the repeated slits 140 is not limited to the two rows and thus the number of the rows of the repeated slits 140 include a single row and equal to or more than the two rows.

An exemplary embodiment of the present disclosure may further include at least a groove 130 in the second direction. Furthermore, if the groove 130 is in plural, the plurality of the grooves 130 is formed in the first direction.

In addition, in an exemplary embodiment of the present disclosure, the narrowing portion 110 can be formed by the slit 140, the groove 130 or a combination of the slit 140 and the groove 130.

On the other hand, as shown in FIG. 5, the narrowing portion 110 may be implemented in a step-difference shape in which thickness in the third direction is reduced compared to the end portions of the first bus bar 100 and a step difference is provided from the end portions of the first bus bar 100, instead of perforations being made at a plurality of points between the end portions of the first bus bar 100 in the third direction.

The shapes of the narrowing portions 110 illustrated in FIG. 1 and FIGS. 4 and 5 are all intended to form a section in which the cross-sectional area in the first direction is reduced between the end portions of the first bus bar 100. Furthermore, the section may be adopted as a structure of the narrowing portion 110 as long as the shape connects the end portions of the first bus bar 100 even if the cross-sectional area is reduced in the first direction.

In addition, in an exemplary embodiment of the present disclosure, the narrowing portion 110 can be formed by the perforation 120, the groove 130, the slit 140, the step difference or a combination thereof.

On the other hand, when the current flows through the first bus bar 100, the current density increases due to the reduced cross-sectional area of the narrowing portion 110 in the moving direction of the current, and when a current of a certain value or more flows, heat is generated and the temperature rises. When the temperature keeps rising to reach the melting point of the first bus bar 100 or higher, the narrowing portion 110 melts before other portions. When the narrowing portion 110 melts, the end portions of the first bus bar 100 are separated so that no more current flows through the first bus bar 100, and as a result, further damage due to the passage of a large current is prevented.

Furthermore, the above description focuses on the first bus bar 100, but a bus bar assembly according to an exemplary embodiment of the present disclosure may be implemented by applying the narrowing portion 110 to the second bus bar 200 or by applying the narrowing portion 110 to both the first bus bar 100 and the second bus bar 200.

On the other hand, the arc-blocking portion 300 is disposed to surround a portion of the first bus bar 100 and the second bus bar 200 to surround the narrowing portion 110 at the least.

An arc may be generated in the vicinity of the narrowing portion 110 in a process of separating the end portions of the first bus bar 100 by the melting of the narrowing portion 110, and as a result, neighboring equipment may be damaged. Accordingly, the arc-blocking portion 300 surrounds the vicinity of the narrowing portion 110 and blocks the arc when the arc is generated in the narrowing portion 110, preventing damage to the surrounding area.

To the present end, the arc-blocking portion 300 may be provided with an arc extinguisher such as silica and may also be provided with a packaging material for accommodating the arc extinguisher. For example, when an arc is generated in the narrowing portion 110, the arc extinguisher is released from the packing material, and the released arc extinguisher absorbs the heat during melting, preventing burnout in the surrounding area.

The magnetic core 400 is disposed on the outside of the arc-blocking portion 300 and may be implemented using a magnetic material such as ferrite. The magnetic core 400 simultaneously surrounds a portion of the first bus bar 100 and a portion of the second bus bar 200 on the outside of the arc-blocking portion 300 and may be implemented in a circular shape, for example.

The magnetic core 400 configured in the present manner can reduce electromagnetic waves by absorbing electromagnetic noise components formed between the first bus bar 100 and the second bus bar 200 spaced from each other.

As described above, the arc-blocking portion 300 surrounds the vicinity of the narrowing portion 110 and the magnetic core 400 surrounds the bus bars 100, 200 on the outside of the arc-blocking portion 300 so that an integrated structure of a fuse and an electromagnetic wave reduction device that ensures reduced overall volume and full performance of the respective functions may be provided.

On the other hand, the housing 500 accommodates respective portions of the first bus bar 100 and the second bus bar 200, the arc-blocking portion 300, and the magnetic core 400 and may be implemented using a plastic material, for example. The housing 500 accommodates and protects components such as the arc-blocking portion 300, the magnetic core 400, and the like, and as illustrated in FIG. 2, the arc-blocking portion 300 and the magnetic core 400 in the fully assembled state are blocked from external exposure by the housing 500.

A first space 501 in which portions of the first bus bar 100 and the second bus bar 200 and the arc-blocking portion 300 are disposed and a second space 502 provided on the outside of the first space 501 for the magnetic core 400 to be disposed therein and separated from the first space 501 may be provided inside the housing 500.

The housing 500 may have open end portions spaced from each other in the first direction and a partition wall with a smaller periphery than the housing 500 may be provided inside the housing 500. In the instant case, the first space 501 may be formed inside the partition wall 600, and the second space may be formed between the partition wall 600 and the housing 500, wherein the first space 501 and the second space 502 are separated from each other by the partition wall 600.

On the other hand, the housing 500 may include a case 510 including an internal space integrally formed by one end portion, which is closed, and a side extending from the one end portion in the first direction and a cover 520 coupled to the case 510 to close the other end portion spaced from the closed one end portion in the first direction.

In the instant case, a plurality of through holes 511, 512 allowing the passage of the first bus bar 100 and the second bus bar 200 in the first direction may be provided at the closed one end portion and the cover 520 of the case 510. Respective cross-sectional areas of the plurality of through holes 511, 521 may correspond to the cross-sectional areas of the first bus bar 100 or the second bus bar 200.

As a result, the bus bar assembly may be structured so that respective portions of the first bus bar 100 and the second bus bar 200, the narrowing portion 110 in particular, may be disposed in the housing 500 while the arc-blocking portion 300 and the magnetic core 400 are blocked from an external exposure.

On the other hand, the bus bar assembly according to an exemplary embodiment of the present disclosure may be applied to a vehicle, and may be disposed between a battery provided in the vehicle and an inverter converting AC power of the battery into DC power.

The first bus bar 100 and the second bus bar 200 may be disposed between the battery and the inverter and serve as a DC input end portion for supplying the DC power of the battery to the inverter.

In the instant case, the narrowing portion 110 and the arc-blocking portion 300 formed in the first bus bar 100 may protect the inverter from a large current, and the magnetic core 400 surrounding the first bus bar 100 and the second bus bar 200 may improve the electromagnetic wave performance of the inverter by absorbing electromagnetic waves.

According to various embodiments of the present disclosure as described above, the electromagnetic wave reduction core and fuse may be provided in the inverter through a bus bar structure in which the electromagnetic wave reduction core and fuse are integrated.

Furthermore, by reducing the total volume of the electromagnetic wave reduction core and fuse compared to when they are individually provided, it is possible to save space, provide a structure easily applicable to the inverter, and improve space utilization.

Furthermore, integrating individual components allows cost reduction.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of at least one of A and B".

Furthermore, "one or more of A and B" may refer to "one or more of A or B" or "one or more of combinations of one or more of A and B".

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A bus bar assembly comprising:
a first bus bar corresponding to a first pole, extending in a first direction;
a second bus bar, corresponding to a second pole, extending in the first direction, and spaced from the first bus bar in a second direction intersecting the first direction, wherein a narrowing portion with a reduced cross-sectional area is formed on at least one bus bar of the first bus bar and the second bus bar in the first direction between a first end portion and a second end portion of the at least one bus bar;
an arc-blocking portion disposed to surround a portion of the first bus bar and a portion of the second bus bar to surround the narrowing portion;
a magnetic core disposed outside the arc-blocking portion to surround the portions of the first bus bar and the second bus bar; and
a housing accommodating the portions of the first bus bar and the second bus bar, the arc-blocking portion, and the magnetic core in the housing.

2. The bus bar assembly of claim 1, wherein the housing includes:
a first space in which the first bus bar and the second bus bar and the arc-blocking portion are disposed; and
a second space provided on an outside of the first space for the magnetic core to be disposed therein and separated from the first space.

3. The bus bar assembly of claim 2,
wherein the housing includes open end portions spaced from each other in the first direction and a partition wall with a smaller periphery than the housing is provided inside the housing, and
wherein the first space is formed inside the partition wall, and the second space is formed between the partition wall and the housing.

4. The bus bar assembly of claim 1, wherein the housing includes:
a case including an internal space formed by a first end portion of the housing, which is closed, and a side extending from the closed one end portion in the first direction; and
a cover coupled to the case to close a second end portion of the housing spaced from the closed one end portion in the first direction,
wherein a plurality of through holes allowing passage of the first bus bar and the second bus bar in the first direction is provided at the closed one end portion and the cover of the case.

5. The bus bar assembly of claim 4, wherein first end portions of the first bus bar and the second bus bar are positioned in a first side of the case by passing through the plurality of through holes, and second end portions of the first bus bar and the second bus bar are positioned in a second side of the case without passing through the plurality of through holes.

6. The bus bar assembly of claim 4, wherein respective cross-sectional areas of the plurality of through holes correspond to cross-sectional areas of the first bus bar and the second bus bar.

7. The bus bar assembly of claim 1, wherein the narrowing portion includes at least a perforation formed between the first and second end portions of the at least one bus bar in a third direction crossing the first direction and the second direction.

8. The bus bar assembly of claim 7, wherein the at least one perforation is in plural and the plurality of perforations is formed between the first and second end portions of the at least one bus bar.

9. The bus bar assembly of claim 8, wherein the plurality of perforations is formed in the third direction, repeating in the second direction.

10. The bus bar assembly of claim 9, wherein the plurality of perforations is formed at repeated positions spaced from each other in the first direction on the at least one bus bar.

11. The bus bar assembly of claim 8, wherein the plurality of perforations is slits elongating at positions spaced from each other in the first direction or the second direction on the at least one bus bar.

12. The bus bar assembly of claim 7, wherein the at least one perforation is at least a slit formed in the first direction or the second direction on the at least one bus bar.

13. The bus bar assembly of claim 1, wherein the narrowing portion includes a reduced thickness compared to the first and second end portions of the at least one bus bar in a third direction crossing the first direction and the second direction.

14. The bus bar assembly of claim 13, wherein the narrowing portion further includes a step difference from the first and second end portions of the at least one bus bar.

15. The bus bar assembly of claim 13, wherein the narrowing portion further includes at least a perforation formed between the first and second end portions of the at least one bus bar in the third direction crossing the first direction and the second direction.

16. The bus bar assembly of claim 15, wherein the at least a perforation is at least a slit elongating in the first direction or the second direction on the at least one bus bar.

17. The bus bar assembly of claim 13, wherein the narrowing portion includes at least one groove formed on a lateral side of the narrowing portion.

18. The bus bar assembly of claim 1, wherein the narrowing portion includes at least one groove formed on a lateral side of the narrowing portion.

19. The bus bar assembly of claim 1, wherein the first bus bar and the second bus bar are disposed between a battery provided in a vehicle and an inverter converting DC power of the battery into AC power.

* * * * *